United States Patent [19]

Sugiyama et al.

[11] Patent Number: 5,034,630

[45] Date of Patent: Jul. 23, 1991

[54] LOGIC CIRCUIT FOR USE IN D/A CONVERTER HAVING ECL-TYPE GATE STRUCTURE

[75] Inventors: Hisashi Sugiyama; Michinori Nakamura; Yasuhiro Sugimoto, all of Yokohama, Japan

[73] Assignee: Kabushiki Kaisha Toshiba, Japan

[21] Appl. No.: 476,539

[22] Filed: Feb. 7, 1990

[51] Int. Cl.[5] .......................................... H03K 19/086
[52] U.S. Cl. .................................. 307/455; 307/445; 307/463
[58] Field of Search ............... 307/440, 445, 455, 463; 341/144

[56] References Cited

U.S. PATENT DOCUMENTS

| | | | |
|---|---|---|---|
| 3,506,815 | 4/1970 | Stone | 307/445 X |
| 3,896,429 | 7/1975 | Moyer et al. | 307/463 X |
| 4,369,503 | 1/1983 | Isogai | 307/463 X |
| 4,633,104 | 12/1986 | Mallinson | 307/455 X |
| 4,695,826 | 9/1987 | Ando et al. | 341/144 |
| 4,737,664 | 4/1988 | Wilhelm et al. | 307/455 |
| 4,833,473 | 5/1989 | Dingwall | 341/154 |
| 4,837,573 | 6/1989 | Brooks | 341/144 X |
| 4,872,011 | 10/1989 | Pelgrom et al. | 341/144 X |
| 4,910,514 | 3/1990 | Zrmer et al. | 341/144 X |

Primary Examiner—David Hudspeth
Attorney, Agent, or Firm—Banner, Birch, McKie & Beckett

[57] ABSTRACT

A logic circuit outputs state signals of seven different kinds, on the basis of first, second and third digital signals. A first composite gate circuit outputs a logical OR among the first to third digital signals as a first state signal. A first gate circuit outputs a logical OR between the second and third digital signals as a second state signal. A second composite gate circuit is supplied with a logical AND between the first and second digital signals, and outputs a logical OR between the supplied logical AND and the third digital signal as third state signal. A third composite gate circuit is supplied with a logical OR between the first and second digital signals, and outputs a logical AND between the supplied logical OR and the third digital signal as a fifth state signal. A second gate circuit outputs a logical AND between the second and third digital signals as a sixth state signal. A fourth composite gate circuit is supplied with a logical AND between the first and second digital signals, and outputs a logical AND between the supplied logical AND and the third digital signal as a seventh state signal. The third digital signal is output as a fourth state signal without being processed. Each of the above circuits has an emitter coupled logic structure.

14 Claims, 9 Drawing Sheets

INPUT CODES 000 001 010 011 100 101 110 111

| INPUT | | | OUTPUT | | | | | | |
|---|---|---|---|---|---|---|---|---|---|
| IN3 | IN2 | IN1 | OUT1 | OUT2 | OUT3 | OUT4 | OUT5 | OUT6 | OUT7 |
| 0 | 0 | 1 | 1 | 0 | 0 | 0 | 0 | 0 | 0 |
| 0 | 1 | 0 | 1 | 1 | 0 | 0 | 0 | 0 | 0 |
| 0 | 1 | 1 | 1 | 1 | 1 | 0 | 0 | 0 | 0 |
| 1 | 0 | 0 | 1 | 1 | 1 | 1 | 0 | 0 | 0 |
| 1 | 0 | 1 | 1 | 1 | 1 | 1 | 1 | 0 | 0 |
| 1 | 1 | 0 | 1 | 1 | 1 | 1 | 1 | 1 | 0 |
| 1 | 1 | 1 | 1 | 1 | 1 | 1 | 1 | 1 | 1 |

F I G. 4

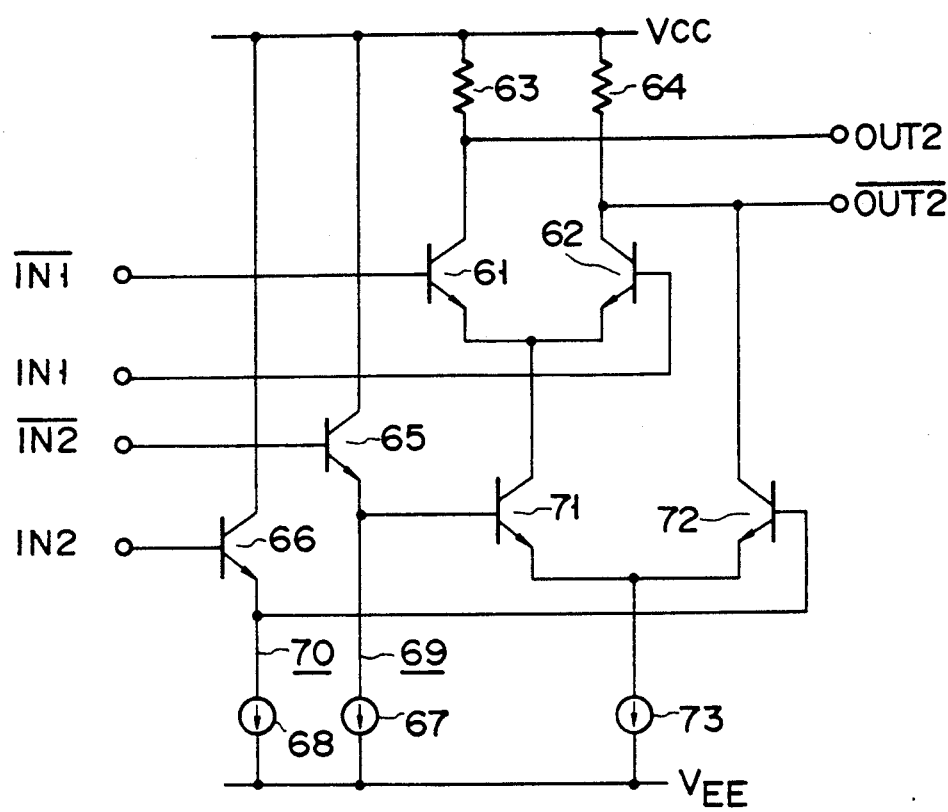
F I G. 6

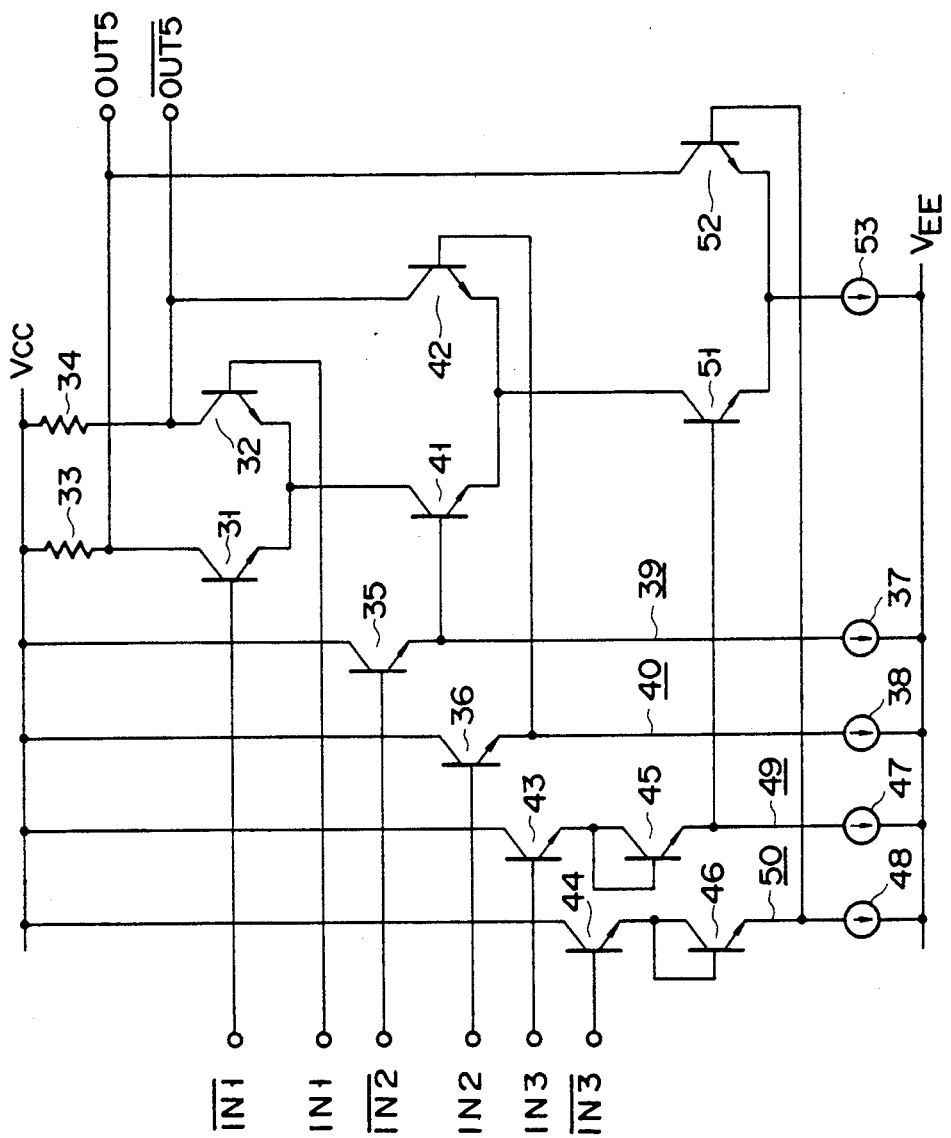
F I G. 8

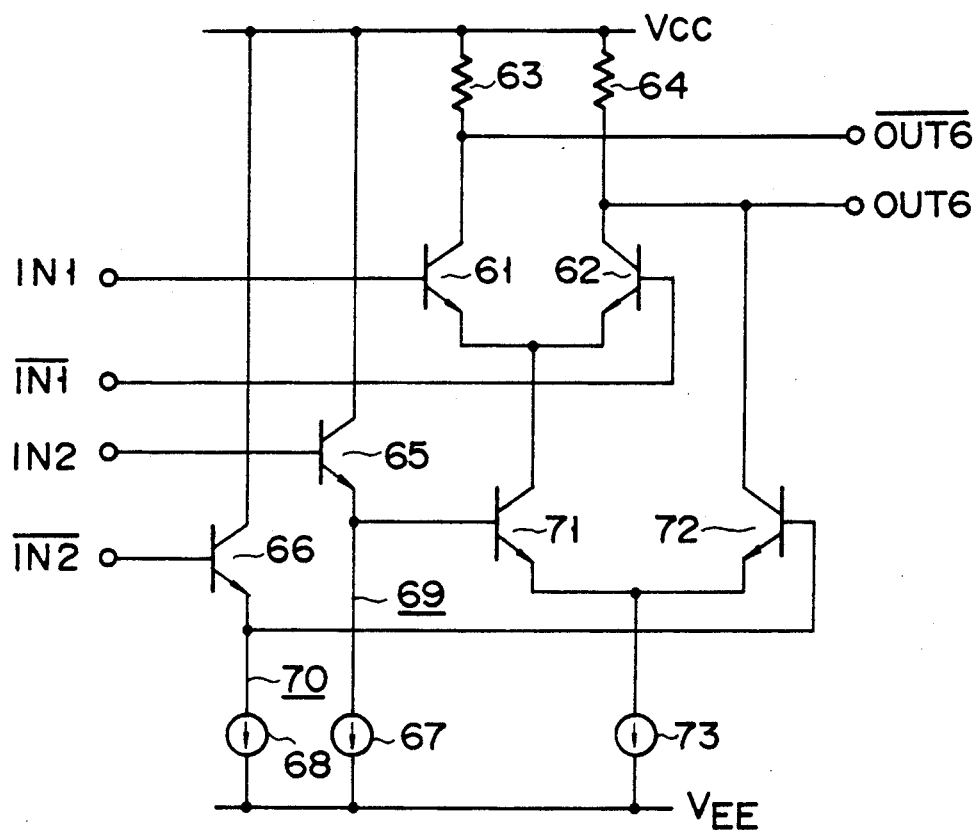
F I G. 9

LOGIC CIRCUIT FOR USE IN D/A CONVERTER HAVING ECL-TYPE GATE STRUCTURE

BACKGROUND OF THE INVENTION

1. Field of the Invention

The present invention relates to a logic circuit which is for use in a digital-to-analog converter (hereinafter referred to simply as a D/A converter) or another circuit device and which is designed to output seven kinds of state signals on the basis of digital signals of three bits.

2. Description of the Related Art

D/A converters are a circuit which converts a digital signal into an analog signal, and are normally employed as an interface inserted between a digital circuit and an analog circuit. Among various types of D/A converters, there is a type which has a resistance ladder circuit structure and is designed specially for a high-speed D/A converter. When digital signals of n bits are converted by this type of D/A converter, the digital signals of lower m bits are used for controlling the current sources of the resistance ladder circuits of the lower m bits, and the digital signals of upper (n-m) bits are used for controlling the current sources of the current summing section of upper (n-m) bits. The upper current summing section serves to generate state signals of $\{2(n-m)-1\}$ kinds from digital signals of upper (n-m) bits for controlling the current sources of $\{2(n-m)-1\}$ kinds. That is, analog methods have been used for generating state signals, for example, state signals of $\{2(n-m)-1\}$ kinds from digital data of (n-m) bits. Conventional state signal generating circuits have the problems that the element characteristics as well as the temperature characteristics of the resistors and current sources used in them can vary with the result that the switching timing of state may not be uniform.

SUMMARY OF THE INVENTION

Accordingly, it is an object of the present invention to provide a logic circuit which easily generates state signals with high speed and exact output timing in accordance with digital signals input thereto and which is not adversely affected by the variation in the element characteristics.

To achieve this object, the present invention provides a logic circuit which outputs state signals of seven kinds on the basis of first, second and third digital signals and which comprises the following structural components:

a first composite gate circuit having an emitter-coupled logic structure and outputting the logical OR among the first to third digital signals as a first state signal;

a first gate circuit having an emitter-coupled logic structure and outputting the logical OR between the second and third digital signals as a second state signal;

a second composite gate circuit having an emitter-coupled logic structure, supplied with the logical AND between the first and second digital signals, and outputting the logical OR between the supplied logical AND and the third digital signal as a third state signal;

a third composite gate circuit having an emitter-coupled logic structure, supplied with the logical OR between the first and second digital signals, and outputting the logical AND between the supplied logical OR and the third digital signal as a fifth state signal;

a second gate circuit having an emitter-coupled logic structure and outputting the logical AND between the second and third digital signals as a sixth state signal; and a fourth composite gate circuit having an emitter-coupled logic structure, supplied with the logical AND between the first and second digital signals, and outputting the logical AND between the supplied logical AND and the third digital signal as a seventh state signal, wherein the third digital signal is output as a fourth state signal.

BRIEF DESCRIPTION OF THE DRAWINGS

The accompanying drawings, which are incorporated in and constitute a part of the specification, illustrate a presently preferred embodiment of the invention, and together with the general description given above and the detailed description of the preferred embodiment given below, serve to explain the principles of the invention.

FIG. 4 is a logical table listing the outputs which the circuit shown in FIG. 1 produces in response to input signals of various logical states;

FIG. 6 shows the circuit arrangement of the OR gate circuit employed in the embodiment;

FIG. 8 shows the circuit arrangement of the third composite gate circuit employed in the embodiment;

FIG. 9 shows the circuit arrangement of the AND gate circuit employed in the embodiment.

DETAILED DESCRIPTION OF THE PREFERRED EMBODIMENTS

A conventional logic circuit and its problems will be first described, prior to explanation of the logic circuit embodying the present invention.

Figure 1:
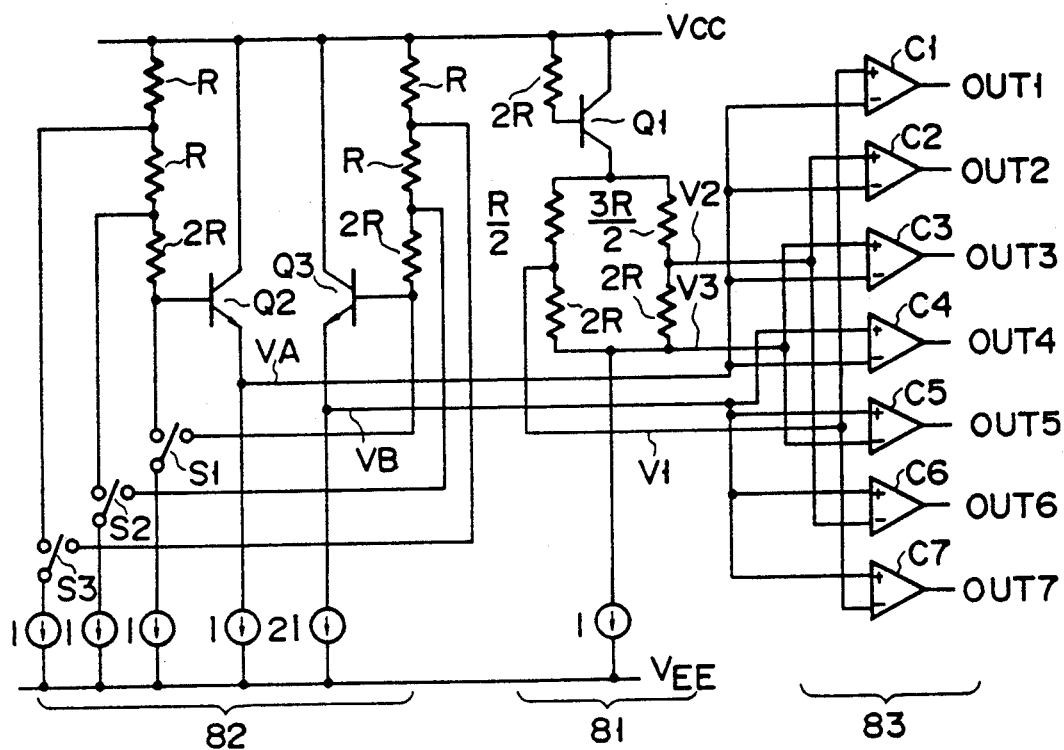
FIG. 1 is a circuit diagram showing the circuit arrangement of a conventional logic circuit.
Figure 2:
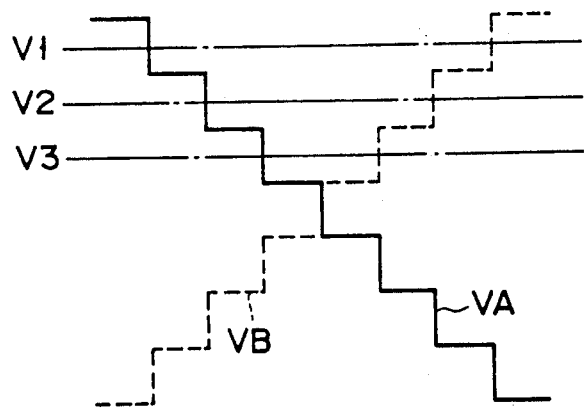
FIG. 2 shows how the circuit shown in FIG. 1 operates.

FIG. 1 is a circuit diagram showing the circuit arrangement of the conventional logic circuit. This logic circuit outputs seven kinds of state signals in response to the input of digital signals of three bits. Referring to FIG. 1, the conventional logic circuit comprises a reference voltage generating section 81, a step-voltage generating section 82, and a voltage comparing section 83. The reference voltage generating section 81 is made up of transistor Q1, a plurality of resistors, and a constant-current source I, and generates such reference voltages V1, V2 and V3 as are shown in FIG. 2. The step-voltage generating section 82 is made up of transistors Q2 and Q3, switches S1-S3, a plurality of resistors, and constant-current sources I and 2I, and generates step-voltages VA and VB. As is shown in FIG. 2, the level of step-voltage VA decreases stepwise and the level of step-voltage VB increases stepwise when switches S1-S3 are selectively operated in accordance with the digital signals of three bits. The voltage comparing section 83 is made up of seven comparators C1-C7, and outputs seven kinds of state signals OUT1–OUT7 by performing comparison among step-voltages VA and VB and reference voltages V1, V2 and V3. In FIG. 2, input codes, each of which is comprised of three bits, are indicated in correspondence to the levels of voltages VA and VB.

When the bits of the digital signals are all "0", i.e., when the input code is (000), voltage VA generated by the step-voltage generating section 82 of the above logic circuit is higher in level than reference voltages V1–V3, and voltage VB also generated by the step-voltage generating section 82 is lower in level than reference voltages V1–V3. In this case, all seven comparators C1–C7 of the voltage comparing section 83 are at the zero level. When the digital signal constituted by the lowermost bit changes from "0" to "1", i.e., when the input code is (001), voltage VA becomes lower in level than reference voltage V1, as is shown in FIG. 2. As a result, the level of output OUT1 of comparator C1 reverses from "0" to "1". Similarly, when the digital signals change such that the input code changes from (001) to (010), the level of output OUT2 of comparator C2 reverses from "0" to "1". In this fashion, the levels of outputs OUT1–OUT7 reverse from "0" to "1" when the input code takes the values of (000), (001), (010), (011), (100), (101), (110), and (111), respectively. It should be noted that the input conditions of the digital signals of three bits have one-to-one correspondence to the seven kinds of state signals to be output. Therefore, each of the state signal outputs always corresponds to the input even if the digital signals do not regularly change.

In the above conventional circuit, the state signals of the seven kinds are output on the basis of the comparison using analog voltages obtained by resistance division. Therefore, if the element characteristics of the resistors and constant-current sources vary during use, the timing of generating state signals can not be uniform, resulting in increased glitches.

The logic circuit of the present invention has been developed, so as to solve this problem.

Figure 3:
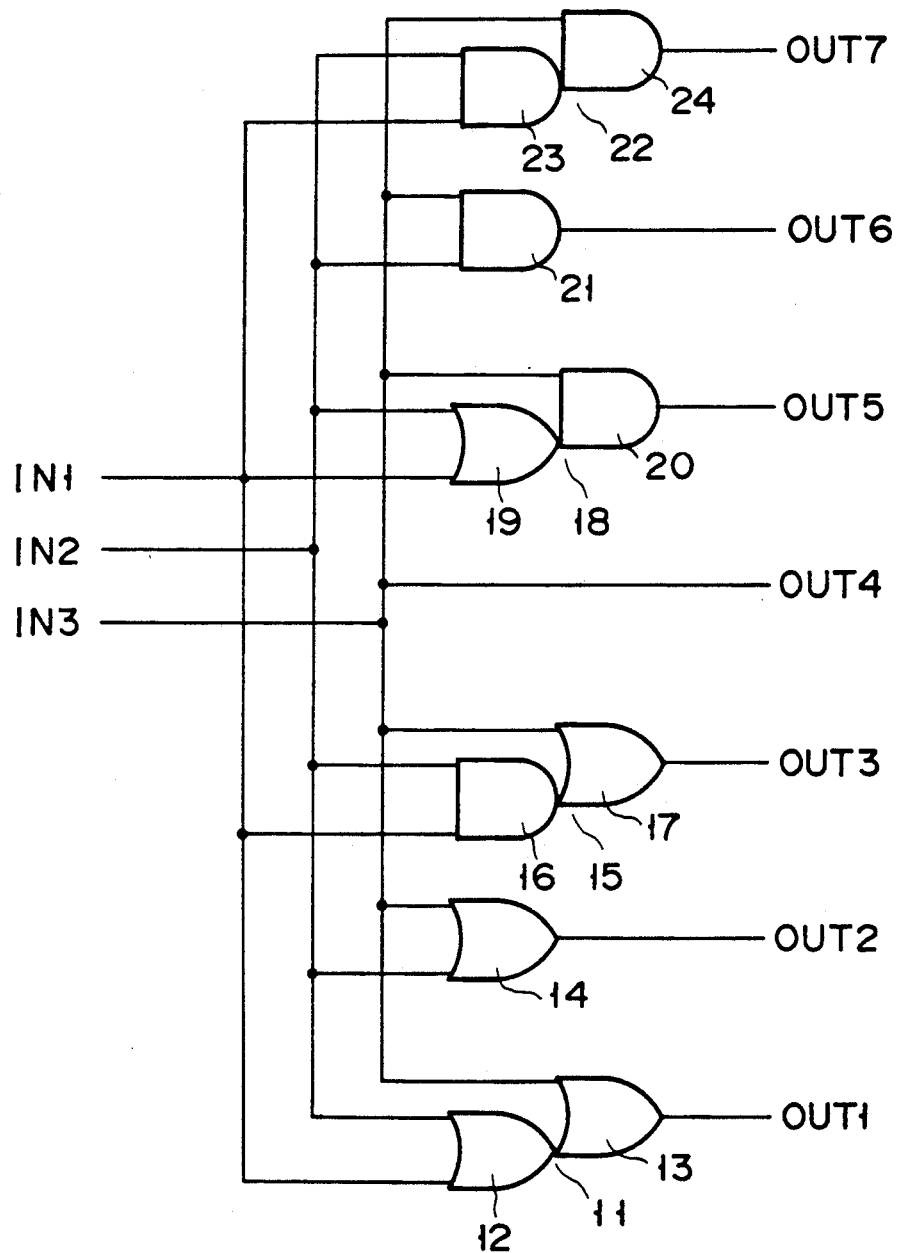
FIG. 3 shows an equivalent circuit diagram corresponding to a logic circuit according to one embodiment of the present invention.

FIG. 3 shows an equivalent circuit diagram corresponding to the case where the present invention is applied to a logic circuit which outputs seven kinds of state signals OUT1–OUT7 in response to the input of digital signals IN1, IN2 and IN3 of three bits. Digital signals IN1 and IN3 are the lowermost-bit and uppermost-bit signals, respectively.

Referring to FIG. 3, a first composite gate circuit 11 is made up of logical OR sections 12 and 13. To obtain a first state output OUT1, signals IN1 and IN2 are supplied to logical OR section 12 of the first composite gate circuit 11, and an output of this logical OR section 12 and signal IN3 are supplied to logical OR section 13. To obtain a second state output OUT2, signals IN2 and IN3 are supplied to an OR gate circuit 14. A second composite gate circuit 15 is made up of logical AND section 16 and logical OR section 17. To obtain a third state output OUT3, signals IN1 and IN2 are supplied to the logical AND section 16 of the composite gate circuit 15, and an output of this logical AND section 16 and signal IN3 are supplied to the logical OR section 17. As a fourth state output OUT4, signal IN3 is output without being processed. A third composite gate circuit 18 is made up of logical OR circuit 19 and logical AND circuit 20. To obtain a fifth state output OUT5, signals IN1 and IN2 are supplied to the logical OR section 19 of the third composite gate circuit 18, and an output of this logical OR section 19 and signal IN3 are supplied to the logical AND section 20. To obtain a sixth state output OUT6, signals IN2 and IN3 are supplied to a logical AND gate circuit 21. A fourth composite gate circuit 22 is made up of logical AND sections 23 and 24. To obtain a seventh state output OUT7, signals IN1 and IN2 are supplied to the logical AND section 23 of the fourth composite gate circuit 22, and an output of this logical AND section 23 and signal IN3 are supplied to the logical AND section 24.

The first through fourth composite circuits 11, 15, 18 and 22, the OR gate circuit 14, and the AND gate circuit 21 are emitter-coupled logic (ECL) circuits. Each of these ECL circuits is basically made up of a pair of transistors whose emitters are connected to each other and whose bases are supplied with complementary signals.

The operation of the circuit having the above arrangement will now be described. When all digital signals IN1, IN2 and IN3 are at the "0" level, the outputs of the first through fourth composite gate circuits 11, 15, 18 and 22, the output of the OR gate circuit 14, and the output of the AND gate circuit 21 are at the "0" level. That is, all outputs OUT1–OUT7 are at the "0" level. When digital signals IN2 and IN3 are at the "0" level and digital signal IN1 is at the "1" level, only output OUT1 (i.e., the output of the first composite gate circuit 11) is at the "1" level. When digital signals IN1 and IN3 are at the "0" level and digital signal IN2 is at the "1" level, output OUT1 of the first composite gate circuit 11 and output OUT2 of the OR gate circuit 14 are at the "1" level. Thereafter, the state signal outputs change in level from "0" to "1" in the order of outputs OUT3, OUT4, OUT5, OUT6 and OUT6, in accordance with an increase in digital signals IN1, IN2 and IN3. The relationship between the inputs and outputs of the FIG. 3 circuit is shown in FIG. 4. As is clear in FIG. 4, the digital signals of three bits are converted into seven kinds of state signals.

In the circuit of the above embodiment, the logical OR and logical AND between the digital signals of three bits are carried out by use of ECL-type gate circuits and ECL-type composite gate circuits, so as to derive seven kinds of state signals from the digital signals of three bits. Due to the use of the ECL-type circuits, the input and output signals of the gate circuits and those of the composite gate circuits are treated in the form of digital signals, which are either "1" or "0" in level. Thus, even if the element characteristics of the gate circuits and those of the composite gate circuits are not uniform, this does not adversely affect the state signal outputs.

FIGS. 5–10 are circuit diagrams showing detailed circuit arrangements of the ECL-type gate circuits and composite gate circuits employed in the embodiment circuit mentioned above.

Figure 5:
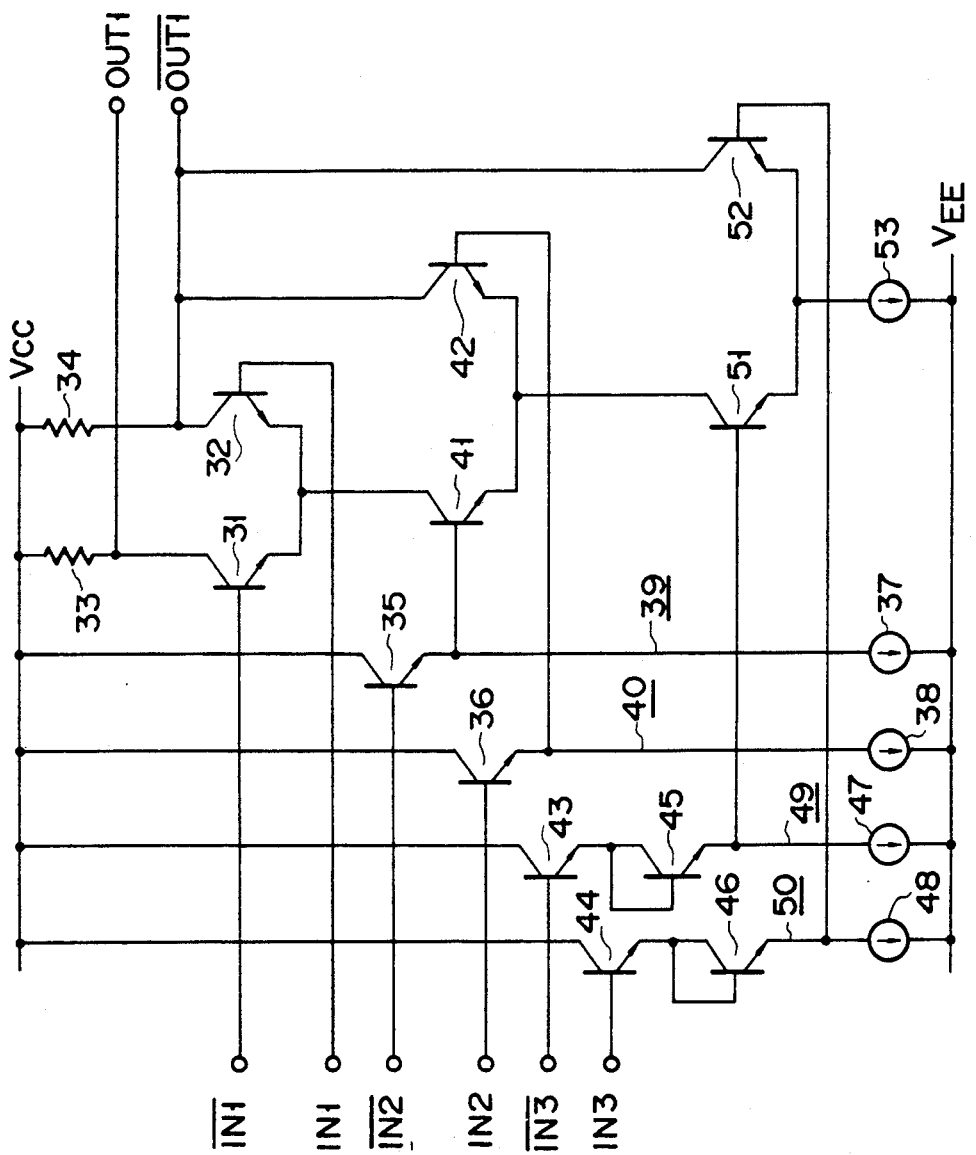
FIG. 5 shows the circuit arrangement of the first composite gate circuit employed in the embodiment.

FIG. 5 is a circuit diagram of the first composite gate circuit 11 used for obtaining state signal output OUT1. This composite gate circuit 11 comprises the following structural components: a pair of NPN transistors 31 and 32 whose emitters are connected to each other and whose bases are supplied with digital signals IN1 and IN1, respectively; load resistors 33 and 34 connected to transistors 31 and 32, respectively; emitter follower circuit 39 which is made up of NPN transistor 35 and constant-current source 37 and which is supplied with digital signal IN2; emitter follower circuit 40 which is made up of NPN transistor 36 and constant-cuurrent source 38 and which is supplied with digital signal IN2; NPN transistor 41 whose base is supplied with an output of emitter follower circuit 39 and whose collector is connected to the common emitter of transistors 31 and 32; NPN transistor 42 whose base is supplied with an output of emitter follower circuit 40, whose collector is connected to the collector of transistor 32, and whose emitter is connected to the emitter of transistor 41; emitter follower circuit 49 which is made up of NPN transistor 43, NPN transistor 45 and constant-current source 47 and which is supplied with digital signal IN3; emitter follower circuit 50 which is made up of NPN transistor 44, NPN transistor 46 and constant-current source 48 and which is supplied with digital signal IN3; NPN transistor 51 whose base is supplied with an output of emitter follower circuit 49 and whose collector is connected to the common emitter of transistors 41 and 42; NPN transistor 52 whose base is supplied with an output of emitter follower circuit 50, whose collector is connected to the collector of transistor 32, and whose emitter is connected to the emitter of transistor 51; and constant-current source 53 connected to the common emitter of transistors 51 and 52. Signals OUT1 and OUT1 are output from the collectors of transistors 31 and 32, respectively.

Transistor 45 and 46 of emitter follower circuits 49 and 50 serve to control the output level.

FIG. 6 is a circuit diagram of the OR gate circuit 14 used for obtaining state signal output OUT2. This OR gate circuit 14 comprises the following structural components: a pair of NPN transistors 61 and 62 whose emitters are connected to each other and whose bases are supplied with digital signals IN1 and IN1, respectively; load resistors 63 and 64 connected to transistors 61 and 62, respectively; emitter follower circuit 69 which is made up of NPN transistor 65 and constant-current source 67 and which is supplied with digital signal IN2; emitter follower circuit 70 which is made up of NPN transistor 66 and constant-current source 68 and which is supplied with digital signal IN2; NPN transistor 71 whose base is supplied with an output of emitter follower circuit 69 and whose collector is connected to the common emitter of transistors 61 and 62; NPN transistor 72 whose base is supplied with an output of emitter follower circuit 70, whose collector is connected to the collector of transistor 62, and whose emitter is connected to the emitter of transistor 71; and constant-current source 73 connected to the common emitter of transistors 71 and 72. Signals OUT2 and OUT2 are output from the collectors of transistors 61 and 62, respectively.

Figure 7:
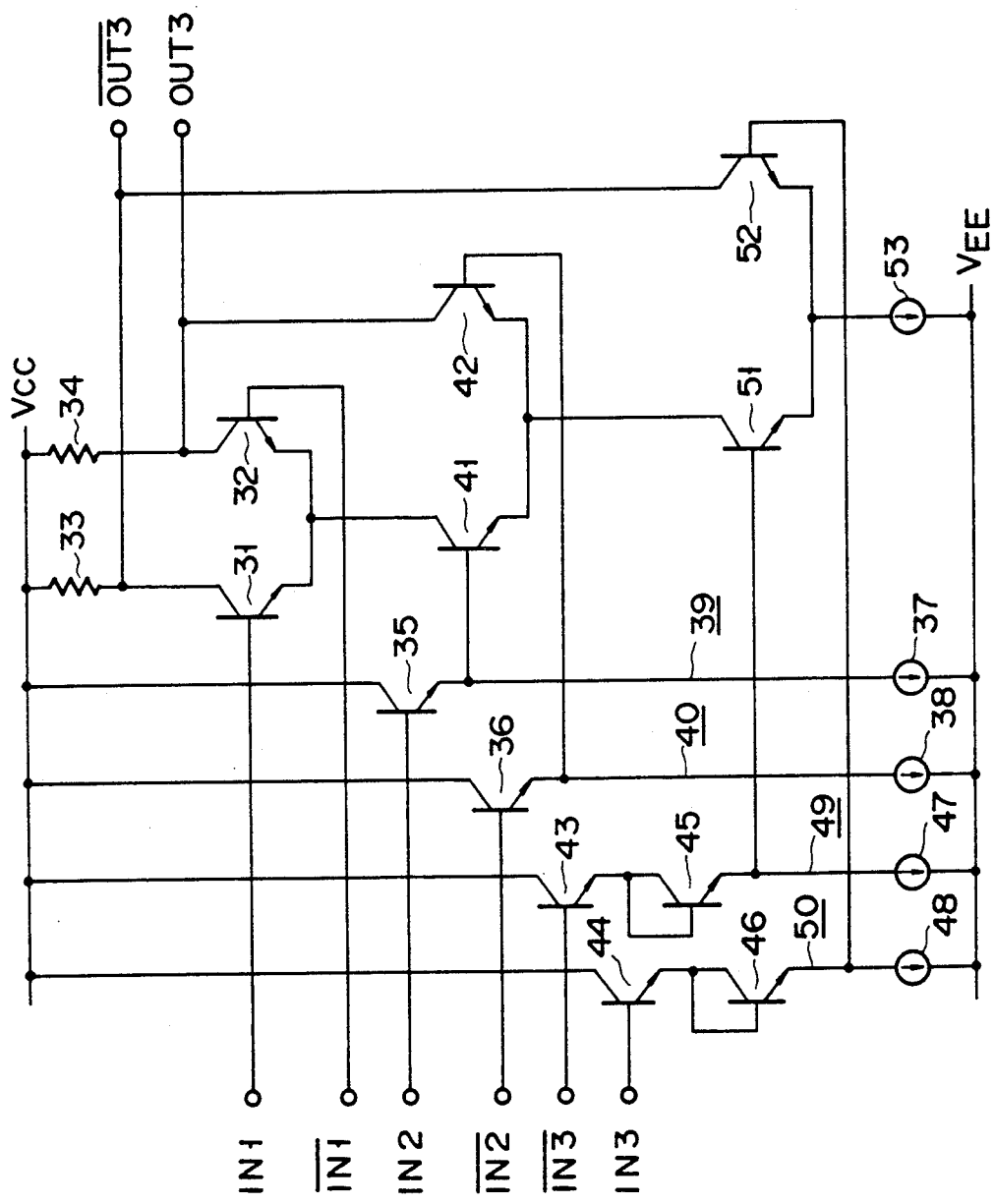
FIG. 7 shows the circuit arrangement of the second composite gate circuit employed in the embodiment.

FIG. 7 is a circuit diagram of the second composite gate circuit 15 used for obtaining state signal output OUT3. This composite gate circuit 15 is similar to the circuit shown in FIG. 5, except that the collector of transistor 52 is connected to the collector of transistor 31, not to the collector of transistor 32, so as to exchange the input terminals of digital signals IN1 and IN1 with each other, and except that the input terminals of digital signals IN2 and IN2 are exchanged with each other. Signals OUT3 and OUT3 are output from the collectors of transistors 31 and 32, respectively.

FIG. 8 is a circuit diagram of the third composite gate circuit 18 used for obtaining state signal output OUT5. This composite gate circuit 18 is similar to the circuit shown in FIG. 7, except that the input terminals of digital signals IN1 and IN1 are exchanged with each other, the input terminals of digital signals IN2 and IN2 are exchanged with each other, and the input terminals of digital signals IN3 and IN3 are exchanged with each other. Signals OUT5 and OUT5 are output from the collectors of transistors 31 and 32, respectively.

FIG. 9 is a circuit diagram of the AND gate circuit 21 used for obtaining state signal output OUT6. This AND gate circuit 21 is similar to the OR gate circuit 14 shown in FIG. 6, except that the input terminals of digital signals IN1 and IN1 are exchanged with each other, and the input terminals of digital signals IN2 and IN2 are exchanged with each other. Signals OUT6 and OUT6 are output from the collectors of transistors 61 and 62, respectively.

Figure 10:
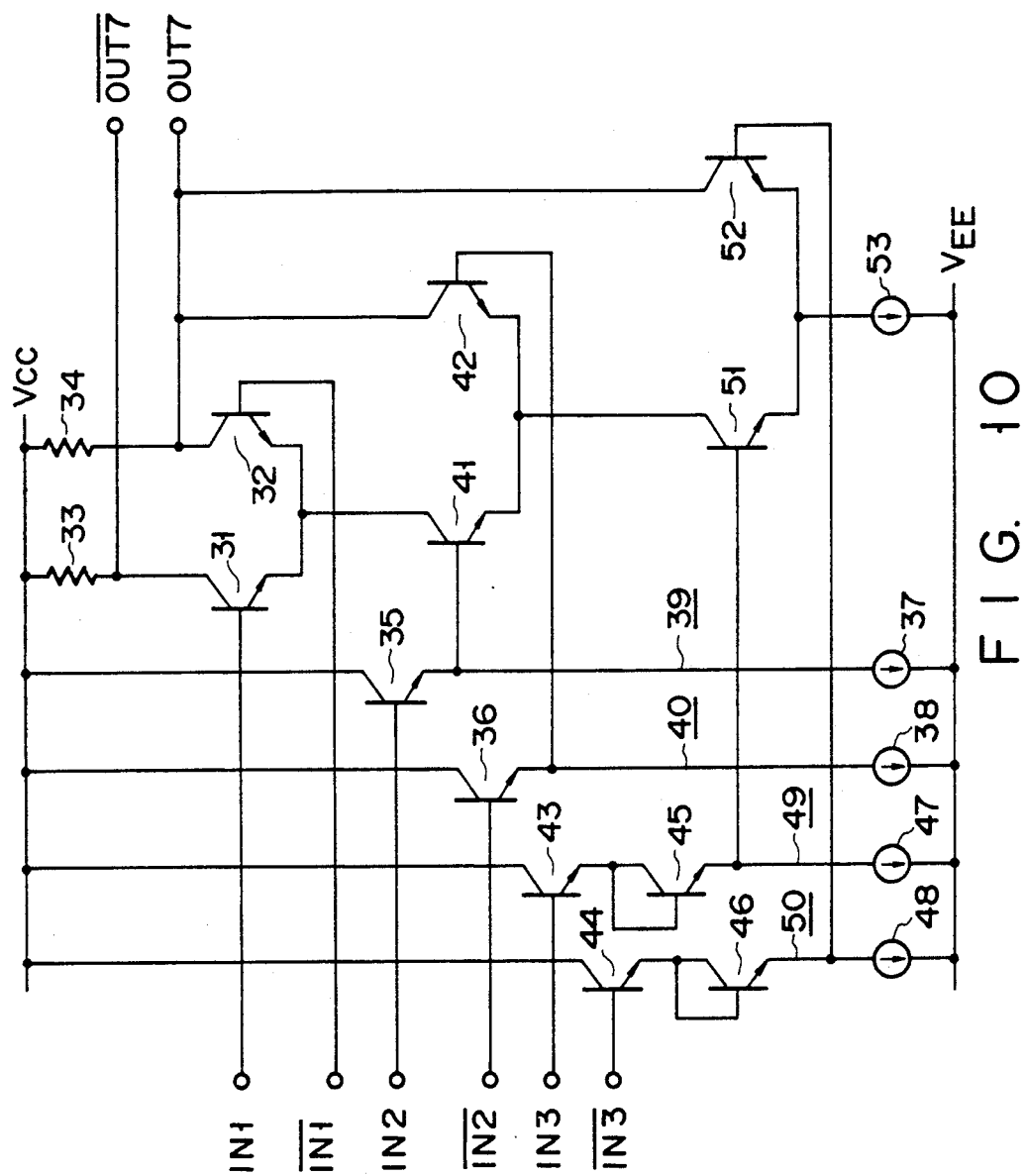
FIG. 10 shows the circuit arrangement of the fourth composite gate circuit employed in the embodiment.

FIG. 10 is a circuit diagram of the fourth composite gate circuit 22 used for obtaining state signal output OUT7. This composite gate circuit 22 is similar to the first composite gate circuit 11 shown in FIG. 5, except that the input terminals of digital signals IN1 and IN1 are exchanged with each other, the input terminals of digital signals IN2 and IN2 are exchanged with each other, and the input terminals of digital signals IN3 and IN3 are exchanged with each other. Signals OUT7 and OUT7 are output from the collectors of transistors 31 and 32, respectively.

In the present invention, an ECL structure is adopted for each structural component of the logic circuit, as mentioned above. With this construction, it is possible to shorten the signal delay time and therefore obtain an output signal at high speed.

As detailed above, the present invention provides a logic circuit which is free from adverse effects arising from ununiform element characteristics and which easily produces, with high speed and exact output timing, a state signal corresponding to a digital signal.

Additional advantages and modifications will readily occur to those skilled in the art. Therefore, the invention in its broader aspects is not limited to the specific details, representative devices, and illustrated examples shown and described herein. Accordingly, various modifications may be made without departing from the spirit or scope of the general inventive concept as defined by the appended claims and their equivalents.

What is claimed is:

1. A logic circuit for outputting state signals of seven kinds on the basis of first, second and third digital signals, comprising:

a first composite gate circuit having an emittercoupled logic structure for outputting a logical OR among the first to third digital signals as a first state signal, wherein said first composite gate circuit includes:

first and second NPN transistors whose emitters are connected to each other;

load resistors connected to the first and second transistors, respectively;

a first emitter follower circuit made up of a third NPN transistor and a first constant-current source;

a second emitter follower circuit made up of a fourth NPN transistor and a second constant-current source;

a fifth NPN transistor having a base connected to the first emitter follower cirucit, and a collector connected to a common emitter of the first and second transistor;

a sixth NPN transistor having a base connected to the second emitter follower circuit a collector connected to the collector of the second transistor, and an emitter connected to the emitter of the fifth transistor;

a third emitter follower circuit made up of a seventh NPN transistor, a ninth NPN transistor and a third constant-current source;

a fourth emitter follower circuit made up of an eighth NPN transistor, a tenth NPN transistor and a fourth constant-current source;

an eleventh NPN transistor having a base connected to the third emitter follower circuit, and a collector connected to a common emitter of the fifth and sixth transistors;

an twelfth NPN transistor having a base connected to the fourth emitter follower circuit, a collector connected to the collector of the second transistor, and an emitter connected to the emitter of the eleventh transistor; and a fifth constant-current source connected to a common emitter of the eleventh and twelfth transistors;

a first gate circuit, connected to said first composite gate circuit and having an emitter-coupled logic structure, for outputting a logical OR between the second and third digital signals as a second state signal;

a second composite gate circuit, connected to said first gate circuit and having an emitter-coupled logic structure, for receiving a logical AND between the first and second digital signals and for outputting a logical OR between the received logical AND and the third digital signal as a third state signal;

a third composite gate circuit, connected to said second composite gate circuit and having an emitter-coupled logic structure, for receiving a logical OR between the first and second digital signals and for outputting a logical AND between the received logical OR and the third digital signal as a fifth state signal;

a second gate circuit, connected to said third composite gate circuit and having an emitter-coupled logic structure, for outputting a logical AND between the second and third digital signals as a sixth state signal; and a fourth composite gate circuit, connected to said second gate circuit and having an emitter-coupled logic structure, for receiving a logical AND between the first and second digital signals and for outputting a logical AND between the received logical AND and the third digital signal as a seventh state signal, wherein the third digital signal is output as a fourth state signal.

2. A logic circuit according to claim 1, wherein said first composite gate circuit includes:

first and second NPN transistors whose emitters are connected to each other;

load resistors connected to the first and second transistors, respectively;

a first emitter follower circuit made up of a third NPN transistor and a first constant-current source;

a second emitter follower circuit made up of a fourth NPN transistor and a second constant-current source;

a fifth NPN transistor having a base connected to the first emitter follower circuit, and a collector connected to a common emitter of the first and second transistors;

a sixth NPN transistor having a base connected to the second emitter follower circuit, a collector connected to the collector of the second transistor, and an emitter connected to the emitter of the fifth transistor;

a third emitter follower circuit made up of a seventh NPN transistor, a ninth NPN transistor and a third constant-current source;

a fourth emitter follower circuit made up of an eighth NPN transistor, a tenth NPN transistor and a fourth constant-current source;

an eleventh NPN transistor having a base connected to the third emitter follower circuit, and a collector connected to a common emitter of the fifth and sixth transistors;

a twelfth NPN transistor having a base connected to the fourth emitter follower circuit, a collector connected to the collector of the second transistor, and an emitter connected to the emitter of the eleventh transistor; and a fifth constant-current source connected to a common emitter of the eleventh and twelfth transistors.

3. A logic circuit according to claim 1, wherein said first gate circuit includes:

first and second NPN transistors whose emitters are connected to each other;

load resistors connected to the first and second transistors, respectively;

a first emitter follower circuit made up of a third NPN transistor and a constant-current source;

a second emitter follower circuit made up of a fourth NPN transistor and a constant-current source;

a fifth NPN transistor having a base connected to the first emitter follower circuit, and a collector connected to a common emitter of the first and second transistors;

a sixth NPN transistor having a base connected to the second emitter follower circuit, a collector connected to the collector of the second transistor, and an emitter connected to the emitter of the first transistor; and a constant-current source connected to a common emitter of the fifth and sixth transistors.

4. A logic circuit according to claim 1, wherein said second composite gate circuit includes:

first and second NPN transistors whose emitters are connected to each other;

load resistors connected to the first and second transistors, respectively;

a first emitter follower circuit made up of a third NPN transistor and a first constant-current source;

a second emitter follower circuit made up of a fourth NPN transistor and a second constant-current source;

a fifth NPN transistor having a base connected to the first emitter follower circuit, and a collector connected to a common emitter of the first and second transistors;

a sixth NPN transistor having a base connected to the second emitter follower circuit, a collector connected to the collector of the second transistor, and an emitter connected to the emitter of the fifth transistor;

a third emitter follower circuit made up of a seventh NPN transistor, a ninth NPN transistor and a third constant-current source;

a fourth emitter follower circuit made up of an eighth NPN transistor, a tenth NPN transistor and a fourth constant-current source;

an eleventh NPN transistor having a base connected to the third emitter follower circuit, and a collector connected to a common emitter of the fifth and sixth transistors;

a twelfth NPN transistor having a base connected to the fourth emitter follower circuit, a collector connected to the collector of the first transistor, and an emitter connected to the emitter of the eleventh transistor; and a fifth constant-current source connected to a common emitter of the eleventh and twelfth transistors.

5. A logic circuit according to claim 1, wherein said third composite gate circuit includes:

first and second NPN transistors whose emitters are connected to each other;

load resistors connected to the first and second transistors, respectively;

a first emitter follower circuit made up of a third NPN transistor and a first constant-current source;

a second emitter follower circuit made up of a fourth NPN transistor and a second constant-current source;

a fifth NPN transistor having a base connected to the first emitter follower circuit, and a collector connected to a common emitter of the first and second transistors;

a sixth NPN transistor having a base connected to the second emitter follower circuit, a collector connected to the collector of the second transistor, and an emitter connected to the emitter of the fifth transistor;

a third emitter follower circuit made up of a seventh NPN transistor, a ninth NPN transistor and a third constant-current source;

a fourth emitter follower circuit made up of an eighth NPN transistor, a tenth NPN transistor and a fourth constant-current source;

an eleventh NPN transistor having a base connected to the third emitter follower circuit, and a collector connected to a common emitter of the fifth and sixth transistors;

a twelfth NPN transistor having a base connected to the fourth emitter follower circuit, a collector connected to the collector of the first transistor, and an emitter connected to the emitter of the eleventh transistor; and a fifth constant-current source connected to a common emitter of the eleventh and twelfth transistors.

6. A logic circuit according to claim 1, wherein said second gate circuit includes:

first and second NPN transistors whose emitters are connected to each other;

load resistors connected to the first and second transistors, respectively;

a first emitter follower circuit made up of a third NPN transistor and a constant-current source;

a second emitter follower circuit made up of a fourth NPN transistor and a constant-current source;

a fifth NPN transistor having a base connected to the first emitter follower circuit, and a collector connected to a common emitter of the first and second transistors;

a sixth NPN transistor having a base connected to the second emitter follower circuit, a collector connected to the collector of the second transistor, and an emitter connected to the emitter of the first transistor; and a constant-current source connected to a common emitter of the fifth and sixth transistors.

7. A logic circuit according to claim 1, wherein said fourth composite gate circuit includes:

first and second NPN transistors whose emitters are connected to each other;

load resistors connected to the first and second transistors, respectively;

a first emitter follower circuit made up of a third NPN transistor and a first constant-current source;

a second emitter follower circuit made up of a fourth NPN transistor and a second constant-current source;

a fifth NPN transistor having a base connected to the first emitter follower circuit, and a collector connected to a common emitter of the first and second transistors;

a sixth NPN transistor having a base connected to the second emitter follower circuit, a collector connected to the collector of the second transistor, and an emitter connected to the emitter of the fifth transistor;

a third emitter follower circuit made up of a seventh NPN transistor, a ninth NPN transistor and a third constant-current source;

a fourth emitter follower circuit made up of an eighth NPN transistor, a tenth NPN transistor and a fourth constant-current source;

an eleventh NPN transistor having a base connected to the third emitter follower circuit, and a collector connected to a common emitter of the fifth and sixth transistors;

a twelfth NPN transistor having a base connected to the fourth emitter follower circuit, a collector connected to the collector of the second transistor, and an emitter connected to the emitter of the eleventh transistor; and a fifth constant-current source connected to a common emitter of the eleventh and twelfth transistors.

8. A logic circuit for outputting state signals of seven kinds on the basis of first, second and third digital signals, comprising:

a first composite gate circuit having an emitter-coupled logic structure for outputting a logical OR among the first to third digital signals and complementary signals thereof as a first state signal and a complementary signal thereof;

a first gate circuit, connected to said first composite gate circuit and having an emitter-coupled logic structure, for outputting a logical OR among the second and third digital signals and complementary signals thereof as a second state signal and a complementary signal thereof;

a second composite gate circuit, connected to said first gate circuit and having an emitter-coupled logic structure, for receiving a logical AND among the first and second digital signals and complementary signals thereof and for outputting a logical OR among the received logical AND, the third digital signal, and a complementary signal thereof as a third state signal and a complementary signal thereof;

a third composite gate circuit, connected to said second composite gate circuit and having an emitter-coupled logic structure, for receiving a logical OR among the first and second digital signals and complementary signals thereof and for outputting a logical AND among the received logical OR, the third digital signal, and a complementary signal thereof as a fifth state signal and a complementary signal thereof;

a second gate circuit, connected to said third composite gate circuit and having an emitter-coupled logic structure, for outputting a logical AND among the second and third digital signals and complementary signals thereof as a sixth state signal and a complementary signal thereof; and a fourth composite gate circuit, connected to said second gate circuit and having an emitter-coupled logic structure, for receiving a logical AND among the first and second digital signals and complementary signals thereof and for outputting the received logical AND, the third digital signal and a complementary signal thereof as a seventh state signal and a complementary signal thereof, wherein the third digital signal and the complementary signal thereof are output as a fourth state signal and a complementary signal thereof.

9. A logic circuit according to claim 8, wherein said first composite gate circuit includes:

first and second NPN transistors whose emitters are connected to each other;

load resistors connected to the first and second transistors, respectively;

a first emitter follower circuit made up of a third NPN transistor and a first constant-current source;

a second emitter follower circuit made up of a fourth NPN transistor and a second constant-current source;

a fifth NPN transistor having a base connected to the first emitter follower circuit, and a collector connected to a common emitter of the first and second transistors;

a sixth NPN transistor having a base connected to the second emitter follower circuit, a collector connected to the collector of the second transistor, and an emitter connected to the emitter of the fifth transistor;

a third emitter follower circuit made up of a seventh NPN transistor, a ninth NPN transistor and a third constant-current source;

a fourth emitter follower circuit made up of an eighth NPN transistor, a tenth NPN transistor and a fourth constant-current source;

an eleventh NPN transistor having a base connected to the third emitter follower circuit, and a collector connected to a common emitter of the fifth and sixth transistors;

a twelfth NPN transistor having a base connected to the fourth emitter follower circuit, a collector connected to the collector of the second transistor, and an emitter connected to the emitter of the eleventh transistor; and a fifth constant-current source connected to a common emitter of the eleventh and twelfth transistors.

10. A logic circuit according to claim 8, wherein said first gate circuit includes:

first and second NPN transistors whose emitters are connected to each other;

load resistors connected to the first and second transistors, respectively;

a first emitter follower circuit made up of a third NPN transistor and a constant-current source;

a second emitter follower circuit made up of a fourth NPN transistor and a constant-current source;

a fifth NPN transistor having a base connected to the first emitter follower circuit, and a collector connected to a common emitter of the first and second transistors;

a sixth NPN transistor having a base connected to the second emitter follower circuit, a collector connected to the collector of the second transistor, and an emitter connected to the emitter of the first transistor; and a constant-current source connected to a common emitter of the fifth and sixth transistors.

11. A logic circuit according to claim 8, wherein said second composite gate circuit includes:

first and second NPN transistors whose emitters are connected to each other;

load resistors connected to the first and second transistors, respectively;

a first emitter follower circuit made up of a third NPN transistor and a first constant-current source;

a second emitter follower circuit made up of a fourth NPN transistor and a second constant-current source;

a fifth NPN transistor having a base connected to the first emitter follower circuit, and a collector connected to a common emitter of the first and second transistors;

a sixth NPN transistor having a base connected to the second emitter follower circuit, a collector connected to the collector of the second transistor, and an emitter connected to the emitter of the fifth transistor;

a third emitter follower circuit made up of a seventh NPN transistor, a ninth NPN transistor and a third constant-current source;

a fourth emitter follower circuit made up of an eighth NPN transistor, a tenth NPN transistor and a fourth constant-current source;

an eleventh NPN transistor having a base connected to the third emitter follower circuit, and a collector connected to a common emitter of the fifth and sixth transistors;

a twelfth NPN transistor having a base connected to the fourth emitter follower circuit, a collector connected to the collector of the first transistor, and an emitter connected to the emitter of the eleventh transistor; and a fifth constant-current source connected to a common emitter of the eleventh and twelfth transistors.

12. A logic circuit according to claim 8, wherein said third composite gate circuit includes:

first and second NPN transistors whose emitters are connected to each other;

load resistors connected to the first and second transistors, respectively;

a first emitter follower circuit made up of a third NPN transistor and a first constant-current source;

a second emitter follower circuit made up of a fourth NPN transistor and a second constant-current source;

a fifth NPN transistor having a base connected to the first emitter follower circuit, and a collector connected to a common emitter of the first and second transistors;

a sixth NPN transistor having a base connected to the second emitter follower circuit, a collector connected to the collector of the second transistor, and an emitter connected to the emitter of the fifth transistor;

a third emitter follower circuit made up of a seventh NPN transistor, a ninth NPN transistor and a third constant-current source;

a fourth emitter follower circuit made up of an eighth NPN transistor, a tenth NPN transistor and a fourth constant-current source;

an eleventh NPN transistor having a base connected to the third emitter follower circuit, and a collector connected to a common emitter of the fifth and sixth transistors;

a twelfth NPN transistor having a base connected to the fourth emitter follower circuit, a collector connected to the collector of the first transistor, and an emitter connected to the emitter of the eleventh transistor; and a fifth constant-current source connected to a common emitter of the eleventh and twelfth transistors.

13. A logic circuit according to claim 8, wherein said second gate circuit includes:

first and second NPN transistors whose emitters are connected to each other;

load resistors connected to the first and second transistors, respectively;

a first emitter follower circuit made up of a third NPN transistor and a constant-current source;

a second emitter follower circuit made up of a fourth NPN transistor and a constant-current source;

a fifth NPN transistor having a base connected to the first emitter follower circuit, and a collector connected to a common emitter of the first and second transistors;

a sixth NPN transistor having a base connected to the second emitter follower circuit, a collector connected to the collector of the second transistor, and an emitter connected to the emitter of the first transistor; and a constant-current source connected to a common emitter of the fifth and sixth transistors.

14. A logic circuit according to claim 8, wherein said fourth composite gate circuit includes:

first and second NPN transistors whose emitters are connected to each other;

load resistors connected to the first and second transistors, respectively;

a first emitter follower circuit made up of a third NPN transistor and a first constant-current source;

a second emitter follower circuit made up of a fourth NPN transistor and a second constant-current source;

a fifth NPN transistor having a base connected to the first emitter follower circuit, and a collector connected to a common emitter of the first and second transistors;

a sixth NPN transistor having a base connected to the second emitter follower circuit, a collector connected to the collector of the second transistor, and an emitter connected to the emitter of the fifth transistor;

a third emitter follower circuit made up of a seventh NPN transistor, a ninth NPN transistor and a third constant-current source;

a fourth emitter follower circuit made up of an eighth NPN transistor, a tenth NPN transistor and a fourth constant-current source;

an eleventh NPN transistor having a base connected to the third emitter follower circuit, and a collector connected to a common emitter of the fifth and sixth transistors;

a twelfth NPN transistor having a base connected to the fourth emitter follower circuit, a collector connected to the collector of the second transistor, and an emitter connected to the emitter of the eleventh transistor; and a fifth constant-current source connected to a common emitter of the eleventh and twelfth transistors.

* * * * *